(12) United States Patent
Wang

(10) Patent No.: US 10,488,697 B2
(45) Date of Patent: Nov. 26, 2019

(54) PIXEL STRUCTURE AND METHOD OF MANUFACTURING THE SAME, ARRAY SUBSTRATE AND DISPLAY DEVICE

(71) Applicants: BOE Technology Group Co., Ltd., Beijing (CN); Beijing BOE Display Technology Co., Ltd., Beijing (CN)

(72) Inventor: Zhidong Wang, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/708,641

(22) Filed: Sep. 19, 2017

(65) Prior Publication Data

US 2018/0210274 A1    Jul. 26, 2018

(30) Foreign Application Priority Data

Jan. 22, 2017    (CN) .......................... 2017 1 0056983

(51) Int. Cl.
*G02F 1/1335*    (2006.01)
*G02B 5/18*    (2006.01)
(Continued)

(52) U.S. Cl.
CPC ..... *G02F 1/133504* (2013.01); *G02B 5/1809* (2013.01); *G02B 5/1857* (2013.01);
(Continued)

(58) Field of Classification Search
CPC ................................................ G02F 1/133504
See application file for complete search history.

(56) References Cited

U.S. PATENT DOCUMENTS 5,080,465 A  *  1/1992  Laude .................. G02B 5/1866
                                                                    216/24
6,785,009 B1 *  8/2004  Stirton ............... G01N 21/4788
                                                                    257/E21.53
(Continued)

FOREIGN PATENT DOCUMENTS

CN    1553235 A         12/2004
CN    101551482       * 10/2009
(Continued)

OTHER PUBLICATIONS

Office Action, including Search Report, for Chinese Patent Application No. 201710056983.4, dated Dec. 14, 2018, 17 pages.

*Primary Examiner* — Sang V Nguyen
(74) *Attorney, Agent, or Firm* — Westman, Champlin & Koehler, P.A.

(57) ABSTRACT

Embodiments of the present disclosure provide a pixel structure, including a plurality of sub-pixels arranged in an array, each sub-pixel including a display region and a non-display region, the non-display region of each sub-pixel being formed with a thin film transistor therein, the display region of each sub-pixel being formed therein with a sub-wavelength grating for transmitting therethrough light in a predetermined wavelength range. Embodiments of the present disclosure further provide a method of manufacturing a pixel structure, an array substrate including the pixel structure and a display device.

15 Claims, 9 Drawing Sheets

(51) Int. Cl.
*G02F 1/1368* (2006.01)
*G02F 1/1362* (2006.01)
*H01L 27/12* (2006.01)
*G02F 1/1333* (2006.01)
*G02B 5/20* (2006.01)
*H01L 29/66* (2006.01)
*H01L 29/786* (2006.01)
*G02F 1/1337* (2006.01)

(52) U.S. Cl.
CPC ........... *G02B 5/201* (2013.01); *G02F 1/1368* (2013.01); *G02F 1/13624* (2013.01); *G02F 1/133345* (2013.01); *H01L 27/1248* (2013.01); *H01L 27/1262* (2013.01); *H01L 29/6675* (2013.01); *H01L 29/78633* (2013.01); *G02F 1/133707* (2013.01); *G02F 2001/133357* (2013.01); *G02F 2001/133521* (2013.01); *G02F 2001/136222* (2013.01); *G02F 2201/305* (2013.01); *G02F 2202/104* (2013.01); *H01L 29/78645* (2013.01)

(56) References Cited

U.S. PATENT DOCUMENTS

| | | | |
|---|---|---|---|
| 7,826,065 B1* | 11/2010 | Okandan | G01B 11/02 324/244.1 |
| 2004/0062502 A1* | 4/2004 | Levola | G02B 5/1866 385/129 |
| 2004/0227459 A1* | 11/2004 | Imura | H01L 27/3253 313/504 |
| 2005/0078374 A1* | 4/2005 | Taira | G02B 5/1814 359/569 |
| 2010/0322558 A1* | 12/2010 | Ogawa | G02B 6/12007 385/37 |
| 2011/0079782 A1 | 4/2011 | Kim et al. | |
| 2011/0141395 A1* | 6/2011 | Yashiro | G02B 6/0036 349/62 |
| 2011/0151605 A1 | 6/2011 | Yoon | |
| 2012/0206676 A1* | 8/2012 | Chung | G02F 1/133516 349/97 |
| 2013/0100695 A1* | 4/2013 | Yankov | G02B 6/0035 362/602 |
| 2015/0138486 A1* | 5/2015 | Lee | G02F 1/29 349/62 |
| 2016/0274281 A1* | 9/2016 | Lutolf | G02B 5/1852 |
| 2017/0038640 A1* | 2/2017 | Wang | G02F 1/133555 |
| 2017/0180716 A1* | 6/2017 | Li | G02B 3/0056 |
| 2017/0205547 A1* | 7/2017 | Lochbihler | G02B 5/1809 |
| 2018/0052276 A1* | 2/2018 | Klienman | G02B 6/0035 |
| 2018/0083070 A1* | 3/2018 | Zhang | G02F 1/133509 |

FOREIGN PATENT DOCUMENTS

| | | |
|---|---|---|
| CN | 101551482 A | 10/2009 |
| CN | 101963719 A | 2/2011 |
| CN | 102103222 A | 6/2011 |
| CN | 105607371 A | 5/2016 |

* cited by examiner

PIXEL STRUCTURE AND METHOD OF MANUFACTURING THE SAME, ARRAY SUBSTRATE AND DISPLAY DEVICE

CROSS-REFERENCE TO RELATED APPLICATION

The present application claims priority to Chinese Patent Application No. 201710056983.4, filed on Jan. 22, 2017 and entitled "PIXEL STRUCTURE AND METHOD OF MANUFACTURING THE SAME, ARRAY SUBSTRATE AND DISPLAY DEVICE", which is incorporated herein by reference in its entirety.

BACKGROUND OF THE DISCLOSURE

Field of the Disclosure

The present disclosure generally relates to the field of display technologies, and more particularly, to a pixel structure, a method of manufacturing a pixel structure, an array substrate comprising the pixel structure and a display device comprising the array substrate.

Description of the Related Art

Generally, a liquid crystal display device mainly consists of four parts including a backlight unit, an array substrate unit, a liquid crystal unit and a color filter substrate (CF) unit. The color filter substrate filters light emitting from the backlight unit so as to selectively transmit the light therethrough; for example, in a color filter substrate comprising red, green and blue three primary colors, red, green and blue sub-pixel regions of the color filter substrate allow red light, green light and blue light to selectively pass therethrough respectively, thereby achieving color display.

SUMMARY

Embodiments of the present disclosure provide a pixel structure, a method of manufacturing a pixel structure, an array substrate comprising the pixel structure and a display device comprising the array substrate.

According to an aspect of the present disclosure, there is provided a pixel structure, comprising a plurality of sub-pixels arranged in an array, each sub-pixel comprising a display region and a non-display region, the non-display region of each sub-pixel being formed with a thin film transistor therein, wherein the display region of each sub-pixel is formed therein with a sub-wavelength grating for transmitting therethrough light in a predetermined wavelength range.

According to some embodiments, the pixel structure comprises at least three sub-pixels, and the sub-wavelength gratings formed in the display regions of respective sub-pixels have different periods and/or pitches from each other, so as to transmit therethrough light in different predetermined wavelength ranges respectively.

According to some embodiments, the pixel structure comprises a first sub-pixel, a second sub-pixel and a third sub-pixel, and wherein:

the sub-wavelength grating of the first sub-pixel has a period of 400 nm and a pitch of 121 nm, for transmitting red light therethrough;

the sub-wavelength grating of the second sub-pixel has a period of 350 nm and a pitch of 119 nm, for transmitting green light therethrough; and the sub-wavelength grating of the third sub-pixel has a period of 440 nm and a pitch of 263 nm, for transmitting blue light therethrough.

According to some embodiments, each sub-pixel comprises a low temperature polysilicon layer, source and drain electrodes, a gate insulation layer, a gate electrode, an interlayer dielectric layer, a first passivation layer and a planarization layer successively formed on a substrate.

According to some embodiments, the sub-wavelength grating is only formed in the low temperature polysilicon layer.

According to some embodiments, the sub-wavelength grating is formed in layers comprising the low temperature polysilicon layer and at least one selected from a group consisting of the gate insulation layer, the interlayer dielectric layer and the first passivation layer.

According to some embodiments, each sub-pixel comprises a gate electrode, a gate insulation layer, an active layer, source and drain electrodes, and a passivation layer successively formed on a substrate.

According to some embodiments, the sub-wavelength grating is formed in the active layer.

According to some embodiments, the sub-wavelength grating is formed in the gate insulation layer.

According to another aspect of the present disclosure, there is further provided an array substrate, comprising the pixel structure of any of the above described embodiments.

According to a further aspect of the present disclosure, there is further provided a display device, comprising the array substrate of the previous aspect, a backlight unit and a liquid crystal unit.

According to a still further aspect of the present disclosure, there is further provided a method of manufacturing a pixel structure, comprising:

forming a plurality of sub-pixels arranged in an array on a substrate, each sub-pixel comprising a display region and a non-display region;

forming a thin film transistor in the non-display region of each sub-pixel; and forming a sub-wavelength grating in the display region of each sub-pixel, for transmitting therethrough light in a predetermined wavelength range.

According to some embodiments, the step of forming the plurality of sub-pixels arranged in the array on the substrate comprises: forming at least three sub-pixels arranged in the array on the substrate.

According to some embodiments, the step of forming the sub-wavelength grating in the display region of each sub-pixel comprises: forming the sub-wavelength grating in the display region of each of the at least three sub-pixels.

According to some embodiments, the sub-wavelength gratings formed in the display regions of respective sub-pixels have different periods and/or pitches from each other so as to transmit therethrough light in different predetermined wavelength ranges respectively.

According to some embodiments, the method further comprises: forming a low temperature polysilicon layer, source and drain electrodes, a gate insulation layer, a gate electrode, an interlayer dielectric layer, a first passivation layer and a planarization layer successively on the substrate.

According to some embodiments, the step of forming the sub-wavelength grating in the display region of each sub-pixel comprises:

forming the sub-wavelength grating in the low temperature polysilicon layer in the display region of each sub-pixel;

depositing a sacrificial layer on the low temperature polysilicon layer formed therein with the sub-wavelength grating;

removing portions of the sacrificial layer located outside of gaps of the grating;

depositing a gate insulation layer over the low temperature polysilicon layer with the sacrificial layer thereon; and removing portions of the sacrificial layer located within the gaps of the grating through an etching process.

According to some embodiments, the step of forming the sub-wavelength grating in the display region of each sub-pixel comprises:

forming a sub-wavelength grating in the low temperature polysilicon layer, the gate insulation layer, the interlayer dielectric layer and the first passivation layer within the display region of each sub-pixel;

depositing a sacrificial layer on the first passivation layer formed therein with the sub-wavelength grating;

removing portions of the sacrificial layer located outside of gaps of the grating;

depositing a planarization layer over the first passivation layer with the sacrificial layer thereon; and removing portions of the sacrificial layer located within the gaps of the grating through an etching process.

According to some embodiments, the method further comprises: forming a gate electrode, a gate insulation layer, an active layer, source and drain electrodes, and a passivation layer successively on the substrate.

According to some embodiments, the step of forming the sub-wavelength grating in the display region of each sub-pixel comprises:

forming the sub-wavelength grating in the active layer within the display region of each sub-pixel;

depositing a sacrificial layer on the active layer foiled therein with the sub-wavelength grating;

removing portions of the sacrificial layer located outside of gaps of the grating;

depositing a passivation layer over the active layer with portions of the sacrificial layer thereon; and removing portions of the sacrificial layer located within the gaps of the grating through an etching process.

BRIEF DESCRIPTION OF THE DRAWINGS

Other objects and advantages of the present disclosure will become apparent from following description of the present disclosure made with reference to the drawings, which may help comprehensive understanding of the present disclosure.

FIG. 6($b$) is a cross sectional schematic diagram of a pixel structure according to a still further embodiment of the present disclosure, with a sub-wavelength grating being formed in an active layer and a gate insulation layer;

DETAILED DESCRIPTION OF PREFERRED EMBODIMENTS OF THE DISCLOSURE

Technique schemes of the present disclosure will be described in detail hereinafter in combination with exemplary embodiments with reference to the drawings. In the description, same or similar component is indicated by same or similar reference number. Description of the embodiments of the present disclosure with reference to the drawings is intended to describe general concepts of the disclosure and should not be understood to limit the present disclosure.

In addition, in the description as below, numerous specific details are described to provide comprehensive understanding of the embodiments of the present disclosure for ease of presentation. However, it is obvious that one or more embodiments may be implemented without these details. In other situation, known structure and device are shown by means of diagrammatic presentation to simplify the accomplish drawings.

It is noted that in this text, expressions "on . . . ", "formed on . . . ", "arranged on . . . " may mean one layer is directly formed or arranged on another layer, or may indicate one layer is indirectly formed or arranged on another layer, that is, there is another layer (s) between the two layers.

Sizes of structures described in embodiments of the present disclosure are very small, thus sizes and scales of structures shown in figures of embodiments of the present disclosure do not represent actual sizes and scales for purpose of clarity.

As discussed in the section "Description of the Related Art", the above display device comprising the color filter substrate has at least following issues:

(1) the color filter substrate increases in thickness of the display device, which is not adaptable to lighter and thinner development trends of the display device; and (2) the color filter substrate generally has a lower light transmittance, which will adversely affect performances of the display device.

Figure 1:
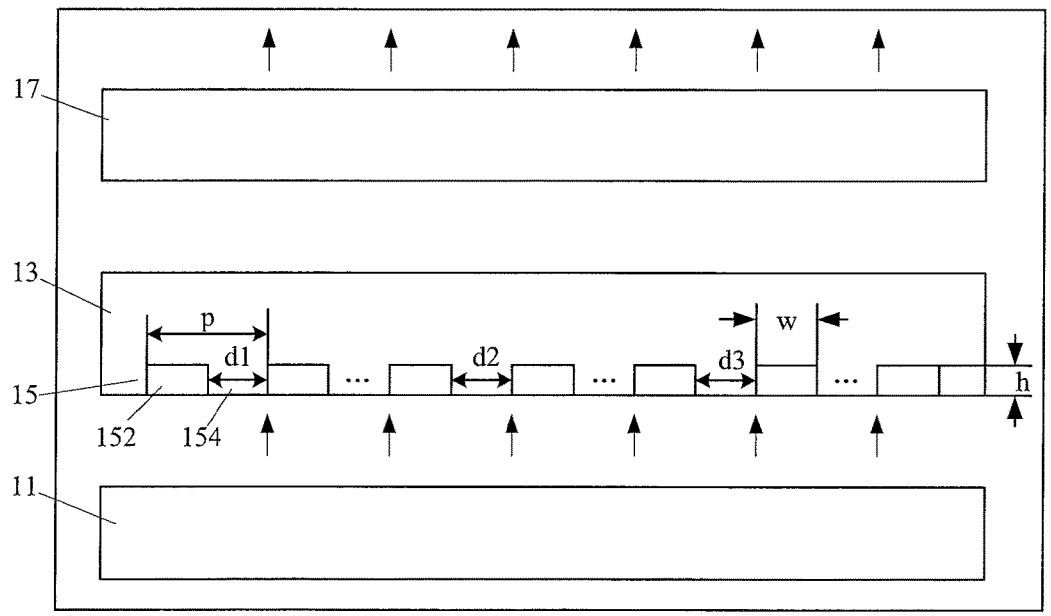
FIG. 1 is a schematic diagram of a display device according to an embodiment of the present disclosure.
Figure 2:
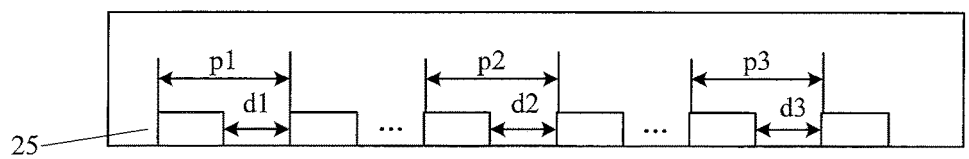
FIG. 2 is a schematic diagram of an array substrate according to an embodiment of the present disclosure.

As shown in FIG. 1 and FIG. 2, a display device 10 according to one embodiment of the present disclosure comprises a backlight unit 11, an array substrate 13 and a liquid crystal unit 17. In one example, the array substrate 13 may be a thin film transistor (TFT) substrate, and as shown in FIG. 1, a sub-wavelength grating 15 is formed in the TFT substrate 13.

A grating often consists of strip-shaped materials spaced apart by gaps having particular pitches. As shown in FIG. 1, the grating 15 comprises ridges 152 formed from a strip-shaped material and gaps 154 between the ridges 152, the height of the grating 15 (that is, the thickness of the strip-shaped material) is h, the width of the ridge of the grating 15 is w, the period p (that is, grating period) of the grating 15 is equal to a sum of the width w of the ridge and the pitch d of the gap 154, and a duty cycle F of the grating 15 is equal to w/p.

When the grating period p has a size comparative (or equivalent) to or smaller than wavelengths of the visible light, the grating will present distinctly different characteristics including reflectivity, transmissivity, polarization property, spectral characteristic and the like when compared to conventional diffractive optical elements, and this kind of grating is called as a sub-wavelength grating. In the embodiment shown in FIG. 1, the period p of the grating 15 is designed to have a size equivalent to or smaller than the wavelengths of the visible light, that is, the grating 15 is one kind of sub-wavelength grating.

Based on the sub-wavelength grating theory, light of different wavelengths may be filtered out by adjusting the period or pitch (i.e., the pitch of the gap of the grating) of the sub-wavelength grating. As such, as shown in FIG. 2, the sub-wavelength grating 15 is formed in the display region of each sub-pixel of the TFT substrate 13, and the sub-wavelength gratings 15 formed in a plurality of sub-pixels of one pixel structure have different periods p or pitches d from each other, so as to transmit therethrough light of different predetermined wavelength. In the embodiment shown in FIG. 2, for example, the sub-wavelength grating 15 of the sub-pixel 1 has a period of p1 and/or a pitch of d1, for transmitting therethrough red light; the sub-wavelength grating 15 of the sub-pixel 2 has a period of p2 and/or a pitch of d2, for transmitting therethrough green light; the sub-wavelength grating 15 of the sub-pixel 3 has a period of p3 and/or a pitch of d3, for transmitting therethrough blue light. In this way, in embodiments of the present disclosure, different sub-pixels are allowed to transmit therethrough light of different primary colors, such that color display may be achieved. That is to say, in embodiments of the present disclosure, the sub-wavelength grating is formed in the TFT substrate, such that color display may be achieved without additionally providing any color filter substrate. Since the color filter substrate is omitted, the thickness of the display device may be reduced, satisfying lighter and thinner requirements for the display device. Further, since the sub-wavelength grating has a higher light transmittance and there is no light blockage caused due to the color filter substrate, the light transmittance of the display device may be increased.

In the following, a pixel structure having a sub-wavelength grating according to embodiments of the present disclosure will be further described in detail with reference to the drawings.

Figure 3:
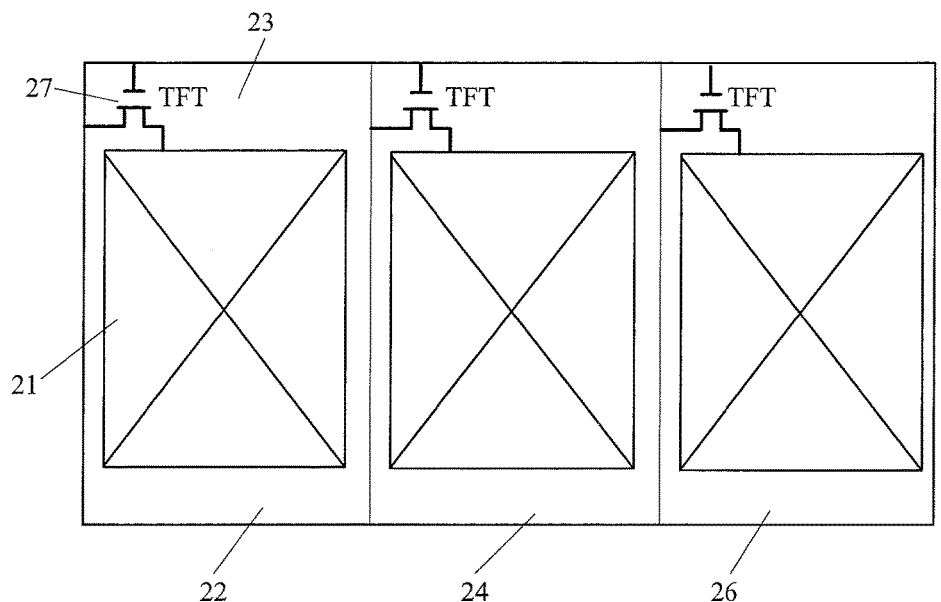
FIG. 3 is a plan schematic diagram of a pixel structure of the array substrate shown in FIG. 2.

As shown in FIG. 2 and FIG. 3, shown is a pixel structure 20 according to one embodiment of the present disclosure. The pixel structure 20 may comprises a plurality of sub-pixels 22, 24, 26 arranged in an array, each sub-pixel comprising a display region 21 and a non-display region 23, and a thin film transistor (TFT) 27 is formed in the non-display region 23 of each sub-pixel. As shown in FIG. 2, the display region 21 of each sub-pixel is formed therein with a sub-wavelength grating 25 for transmitting therethrough light in a predetermined wavelength range.

It is noted that in this text, the "predetermined wavelength range" may match with primary colors which are allowed to be transmitted through the display substrate or array substrate. A display substrate of RGB (red, green, blue) three primary colors will be described as an example. Spectrum distributions of the visible light are listed in following table. For the display substrate adopting the RGB (red, green, blue) three primary colors, the sub-wavelength gratings 25 in the sub-pixels 22, 24, 26 may be designed to transmit therethrough light in wavelength ranges including "about 625~740 nm", "about 500~565 nm" and "about 440~485 nm" respectively.

TABLE 1

Spectrum Distributions of Visible Light

| spectrum color of visible light | wavelength range (nm) |
| --- | --- |
| red (R) | about 625~740 nm |
| orange | about 590~625 nm |
| Yellow | about 565~590 nm |
| green (G) | about 500~565 nm |
| cyan | about 485~500 nm |
| blue (B) | about 440~485 nm |
| purple | about 380~440 nm |

In the illustrated embodiment, the pixel structure 20 comprises three sub-pixels 22, 24, 26, the sub-wavelength gratings 25 formed in the display regions of respective sub-pixels 22, 24, 26 have different periods p and/or pitches d from each other, that is, p1, p2 and p3 are different from each other, and/or d1, d2 and d3 are different from each other, so as to respectively transmit therethrough light of different colors or light in different predetermined wavelength ranges. In one example, the sub-wavelength grating 25 of the first sub-pixel 22 has a period p1 of 400 nm and a pitch d1 of 121 nm, for transmitting therethrough red light; the sub-wavelength grating 25 of the second sub-pixel 24 has a period p2 of 350 nm and a pitch d2 of 119 nm, for transmitting therethrough green light; and the sub-wavelength grating 25 of the third sub-pixel 26 has a period p3 of 440 nm and a pitch d3 of 263 nm, for transmitting therethrough blue light. Experiments show that in this example, transmission peaks of the red, green and blue three colors are 71.1%, 58.1% and 59.3% respectively.

Figure 4:
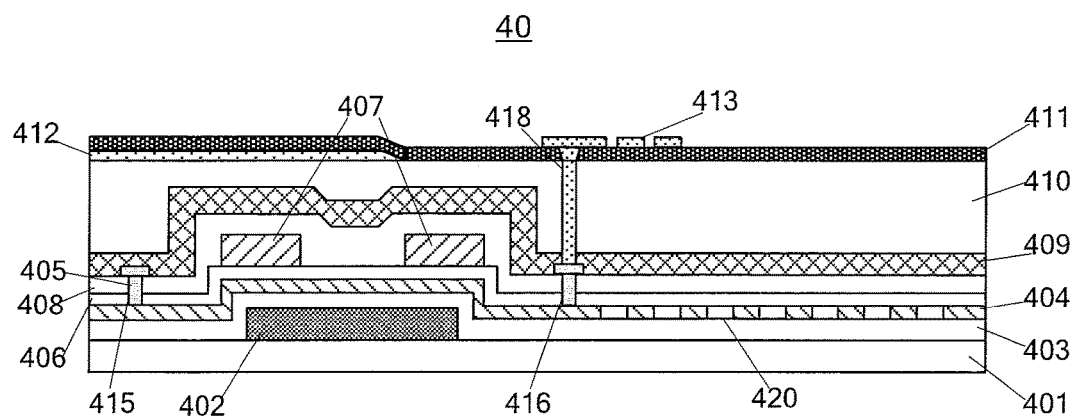
FIG. 4 is a cross sectional schematic diagram of a pixel structure according to one embodiment of the present disclosure.

FIG. 4 shows a cross sectional schematic diagram of a pixel structure according to an exemplary embodiment of the present disclosure. For convenience of description, a structure of one sub-pixel will be described as an example. As shown in FIG. 4, each sub-pixel 40 comprises a substrate 401, a light shielding layer 402, a buffer layer 403, a low temperature polysilicon layer (LTPS) 404, source and drain electrodes 405, a gate insulation layer 406, a gate electrode 407, an interlayer dielectric layer 408, a first passivation layer 409, a planarization layer 410 and a second passivation layer 411. Specifically, the substrate 401 may be a glass substrate, the light shielding layer 402 may include a metal light shielding layer, and the light shielding layer 402, the buffer layer 403, the low temperature polysilicon layer (LTPS) 404, the gate insulation layer 406, the interlayer dielectric layer 408, the first passivation layer 409, the planarization layer 410 and the second passivation layer 411 are successively formed on the substrate 401. The sub-pixel 40 further comprises through holes 415, 416 penetrating through the gate insulation layer 406 and the interlayer dielectric layer 408, the source and drain electrodes 405 are formed on the interlayer dielectric layer 408 and contact the low temperature polysilicon layer 404 by means of the through holes 415, 416 respectively, and the gate electrode 407 is formed on the gate insulation layer 406.

In one example, the sub-pixel 40 further comprises a common electrode 412 and a pixel electrode 413. As shown in FIG. 4, the common electrode 412 and the pixel electrode 413 are each formed above the substrate 401, the pixel electrode 413 is formed on the second passivation layer 411 and contact the source and drain electrodes 405 through a through hole 418 penetrating through the second passivation layer 411, the planarization layer 410 and a portion of the first passivation layer 409, and the common electrode 412 is formed on the planarization layer and is separated from the pixel electrode 413 by means of the second passivation layer 411.

Optionally, TFT of each sub-pixel may comprises two gate electrodes 407, as shown in FIG. 4, the two gate electrodes 407 are spaced apart by the interlayer dielectric layer 408. With this double-gate electrode configuration, off-state leakage current of the TFT may be effectively reduced.

In order to enable the TFT substrate transmitting therethrough light in a predetermined wavelength range, the sub-pixel 40 further comprises a sub-wavelength grating 420. As shown in FIG. 4, the sub-wavelength grating 420 is only formed in the low temperature polysilicon layer 404.

Figure 5:
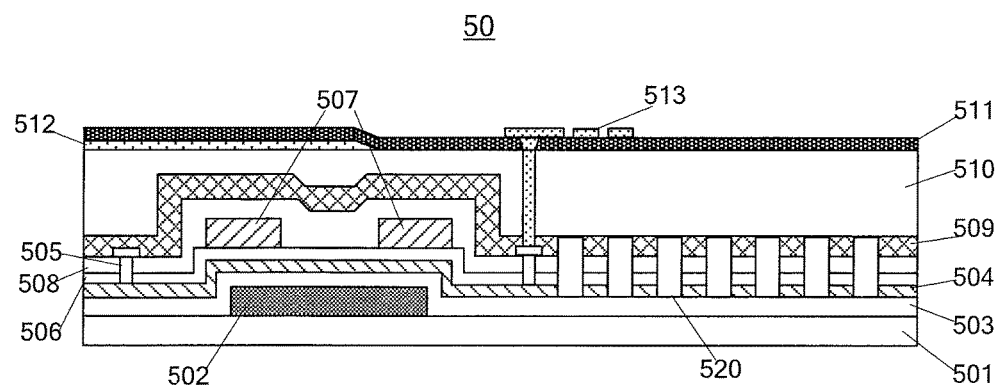
FIG. 5 is a cross sectional schematic diagram of a pixel structure according to another embodiment of the present disclosure.

In an optional embodiment, the sub-wavelength grating may be formed in layers including the low temperature polysilicon layer and at least one selected from a group consisting of the gate insulation layer, the interlayer dielectric layer and the first passivation layer. As shown in FIG. 5, a sub-pixel 50 comprises a substrate 501, a light shielding layer 502, a buffer layer 503, a low temperature polysilicon layer (LTPS) 504, source and drain electrodes 505, a gate insulation layer 506, a gate electrode 507, an interlayer dielectric layer 508, a first passivation layer 509, a planarization layer 510, a second passivation layer 511, a common electrode 512 and a pixel electrode 513. The sub-pixel 50 further comprises a sub-wavelength grating 520, and the sub-wavelength grating 520 is formed in a plurality of layers including the low temperature polysilicon layer 504, the gate insulation layer 506, the interlayer dielectric layer 508 and the first passivation layer 509.

In the above embodiments of low temperature polysilicon TFT, the pixel structure according to embodiments of the present disclosure is described by taking a top gate structure as an example. It will be appreciated that the sub-wavelength grating according to embodiments of the present disclosure may also be applicable in a bottom gate type of low temperature polysilicon TFT, which has similar structures to those shown in FIGS. 4-5 and will not be repeatedly described for purpose of briefness.

Figure 6A:
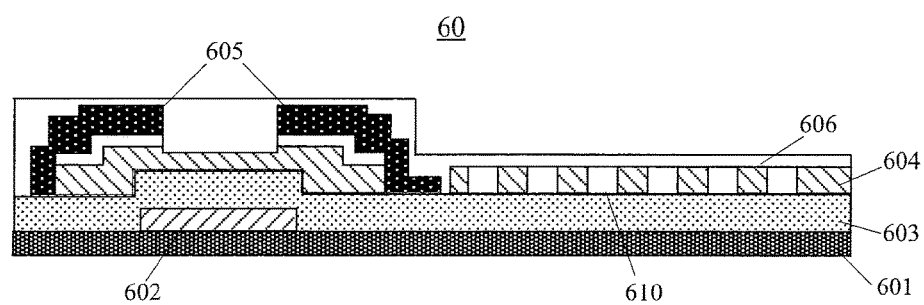
FIG. 6($a$) is a cross sectional schematic diagram of a pixel structure according to a further embodiment of the present disclosure, with a sub-wavelength grating being formed in an active layer.

FIG. 6(a) shows a cross sectional schematic diagram of a pixel structure according to another exemplary embodiment of the present disclosure. For convenience of description, a structure of one sub-pixel will be described hereinafter as an example.

As shown in FIG. 6(a), a sub-pixel 60 comprises a substrate 601, a gate electrode 602, a gate insulation layer 603, an active layer 604, source and drain electrodes 605 and a passivation layer 606. Specifically, the substrate 601 may be a glass substrate, and the gate electrode 602, the gate insulation layer 603, the active layer 604, the source and drain electrodes 605 and the passivation layer 606 are successively formed on the substrate 601.

According to an embodiment of the present disclosure, the sub-pixel 60 further comprises a sub-wavelength grating 610 formed in the active layer 604, such that TFT substrate can achieve transmitting therethrough light in a predetermined wavelength range.

Figure 6B:
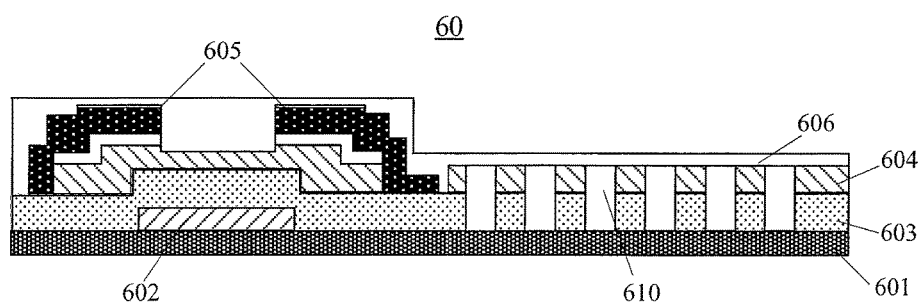

FIG. 6(b) shows a cross sectional schematic diagram of a pixel structure according to a further exemplary embodiment of the present disclosure. The pixel structure shown in FIG. 6(b) differs from the pixel structure shown in FIG. 6(a) only in that: the sub-wavelength grating 610 is formed in both the active layer 604 and the gate insulation layer 603, such that TFT substrate can achieve transmitting therethrough light in a predetermined wavelength range. It will be understood that in an alternative embodiment, the sub-wavelength grating 610 may be only formed in the gate insulation layer 603, so as to achieve the purpose of transmitting therethrough light in the predetermined wavelength range.

According to an embodiment of another aspect of the present disclosure, there is further provided an array substrate, comprising the pixel structure described in any of above embodiments.

According to an embodiment of a further aspect of the present disclosure, there is further provided a display device. Returning to FIG. 1, the display device 10 comprises the backlight unit 11, the array substrate 13 and the liquid crystal unit 15, and the array substrate 13 may comprises the pixel structure described in any of above embodiments.

Figure 7:
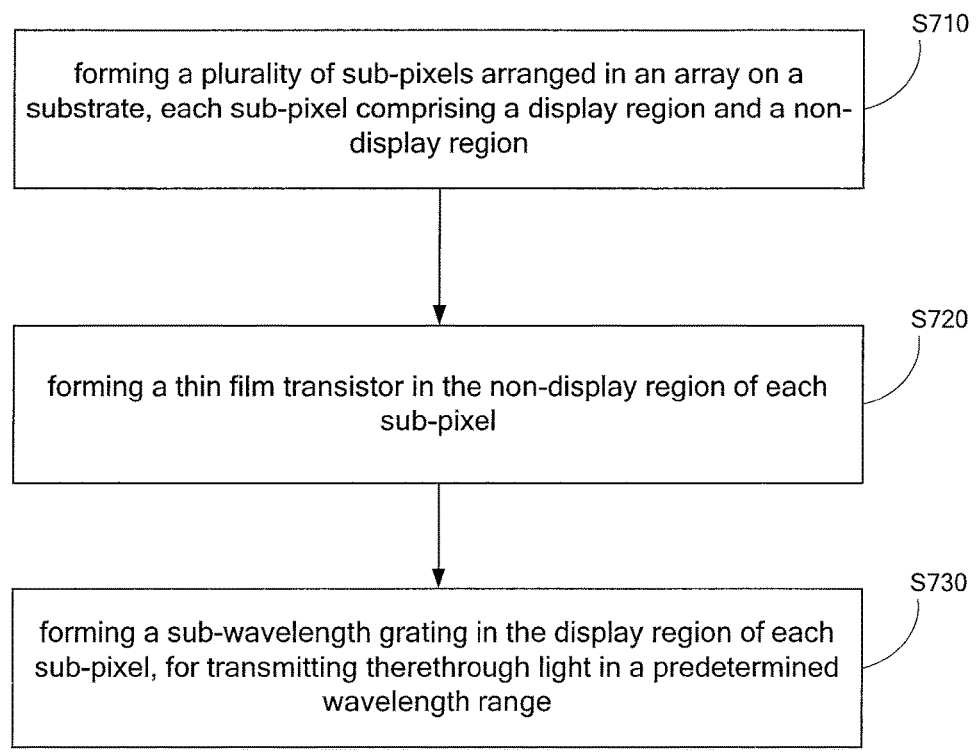
FIG. 7 is a flow chart of a method of manufacturing a pixel structure according to one embodiment of the present disclosure.

According to an embodiment of a further aspect of the present disclosure, there is also provided a method of manufacturing a pixel structure. As shown in FIG. 7, the method of manufacturing a pixel structure comprises following steps:

S710: forming a plurality of sub-pixels arranged in an array on a substrate, each sub-pixel comprising a display region and a non-display region;

S720: forming a thin film transistor in the non-display region of each sub-pixel; and S730: forming a sub-wavelength grating in the display region of each sub-pixel, for transmitting therethrough light in a predetermined wavelength range.

Figure 8:
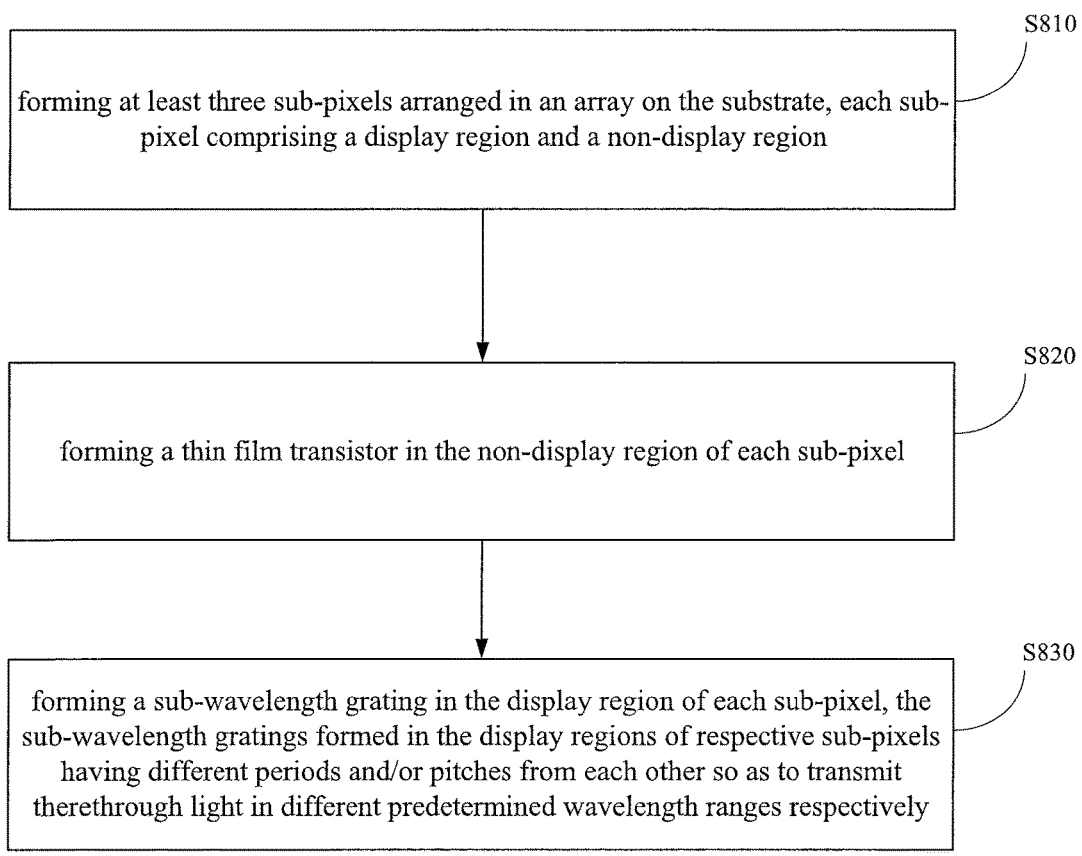
FIG. 8 is a flow chart of a method of manufacturing a pixel structure according to another embodiment of the present disclosure.

In one example, the step S710 may comprise: forming at least three sub-pixels arranged in an array on the substrate, and the step S730 may comprise: forming a sub-wavelength grating in the display region of each of the at least three sub-pixels. The sub-wavelength gratings formed in the display regions of respective sub-pixels have different periods and/or pitches from each other so as to respectively transmit therethrough light in different predetermined wavelength ranges. As such, as shown in FIG. 8, a method of manufacturing a pixel structure according to an embodiment of the present disclosure may comprise following steps:

S810: forming at least three sub-pixels arranged in an array on the substrate, each sub-pixel comprising a display region and a non-display region;

S820: forming a thin film transistor in the non-display region of each sub-pixel; and S830: forming a sub-wavelength grating in the display region of each sub-pixel, the sub-wavelength gratings formed in the display regions of respective sub-pixels having different periods and/or pitches so as to respectively transmit therethrough light in different predetermined wavelength ranges.

According to an embodiment, the method of manufacturing a pixel structure may comprise the following steps: forming a low temperature polysilicon layer, source and drain electrodes, a gate insulation layer, a gate electrode, an interlayer dielectric layer, a first passivation layer and a planarization layer successively on the substrate.

Figure 9:
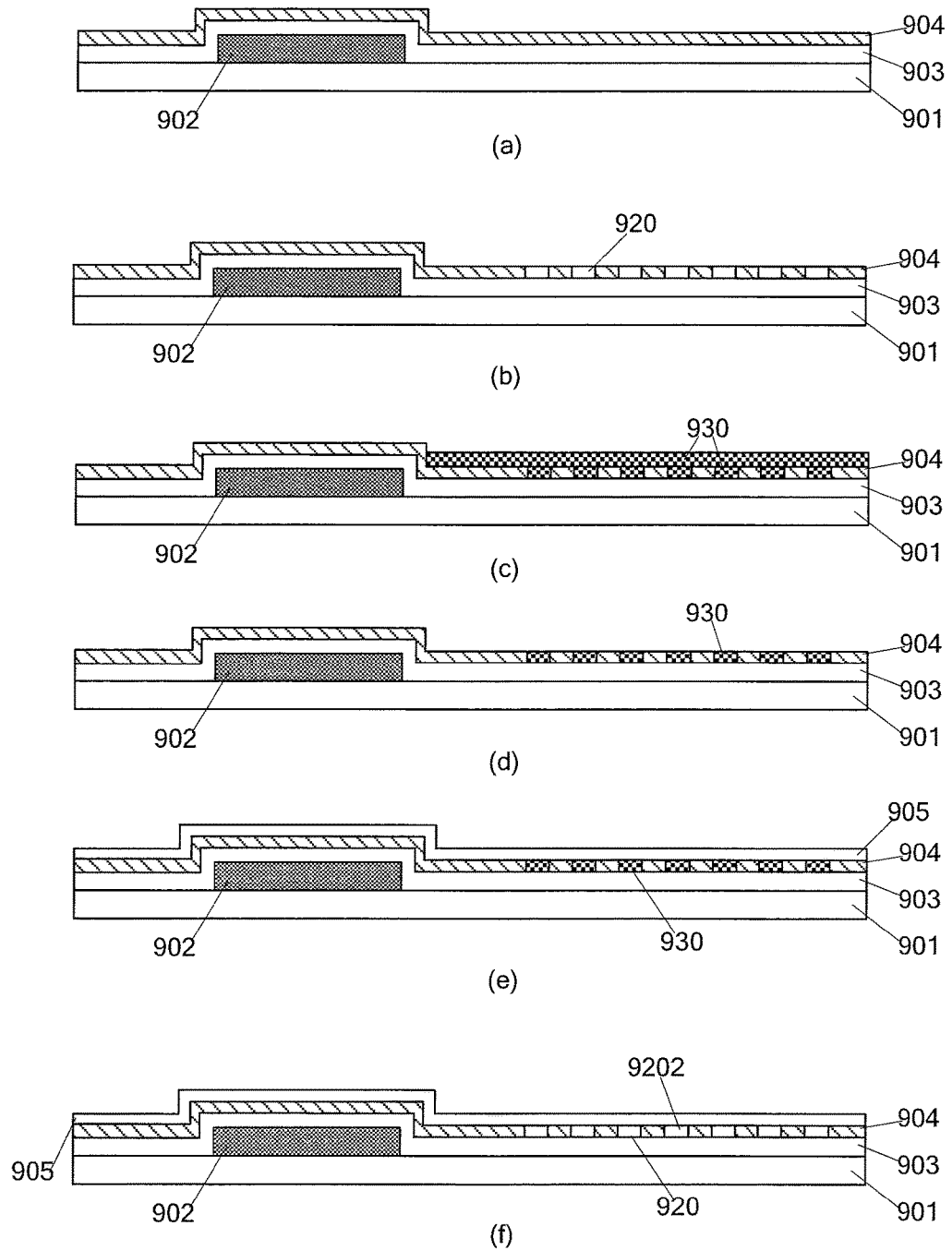
FIG. 9 is a schematic diagram schematically showing steps of a method of forming a sub-wavelength grating according to one embodiment of the present disclosure.

According to an example, as shown in FIG. 9, steps of forming a sub-wavelength grating in the display region of each sub-pixel are illustrated in detail.

As shown in part (a) in FIG. 9, a light shielding layer 902, a buffer layer 903 and a low temperature polysilicon layer 904 are successively formed on a substrate 901. Specifically, a light shielding metal material may be deposited on the substrate 901 and then is formed into a pattern of the light shielding layer 902 through processes including exposure, etching and the like, and then the buffer layer 903 and the low temperature polysilicon layer 904 are deposited.

As shown in part (b) in FIG. 9, a sub-wavelength grating 920 is formed in the low temperature polysilicon layer 904 in the display region of each sub-pixel. Specifically, the sub-wavelength grating 920 may be formed in the low temperature polysilicon layer 904 through a process such as electron beam lithography.

As shown in part (c) in FIG. 9, a sacrificial layer 930 is deposited on the low temperature polysilicon layer 904 formed therein with the sub-wavelength grating 920.

As shown in part (d) in FIG. 9, portions of the sacrificial layer 930 located outside of gaps 9202 of the grating are removed, that is, only portions of the sacrificial layer 930 located in the gaps 9202 of the grating are remained.

As shown in part (e) in FIG. 9, a gate insulation layer 905 is formed over the low temperature polysilicon layer 904 with the sacrificial layer 930 thereon. Specifically, the gate insulation layer 905 may be deposited over the low temperature polysilicon layer 904 with the sacrificial layer 930 thereon.

As shown in part (f) in FIG. 9, the portions of the sacrificial layer 930 located within the gaps 9202 of the grating are removed through an etching process.

Figure 10:
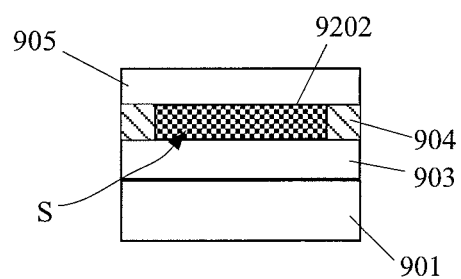
FIG. 10 is a schematic diagram schematically showing etching of a portion of a sacrificial layer located in a gap of a grating.

In the above step of removing portions of the sacrificial layer 930 located within the gaps 9202 of the grating through an etching process, a chemical etching solution S enters the gap 9202 of the grating from either side of the grating gaps 9202, so as to etch the portions of the sacrificial layer 930 located within the gaps 9202 of the grating, as shown in FIG. 10.

It will be understood that the method of manufacturing a pixel structure further comprises steps of forming other layers or structures above the substrate, for example, forming layers or structures of the array substrate, such as the source and drain electrodes, the gate electrode, the interlayer dielectric layer, the first passivation layer and the planarization layer, the second passivation layer, the common electrode, the pixel electrode and the like, which may be formed through conventional methods for forming these layers or structures and will not be repeatedly described for purpose of briefness.

Figure 11:
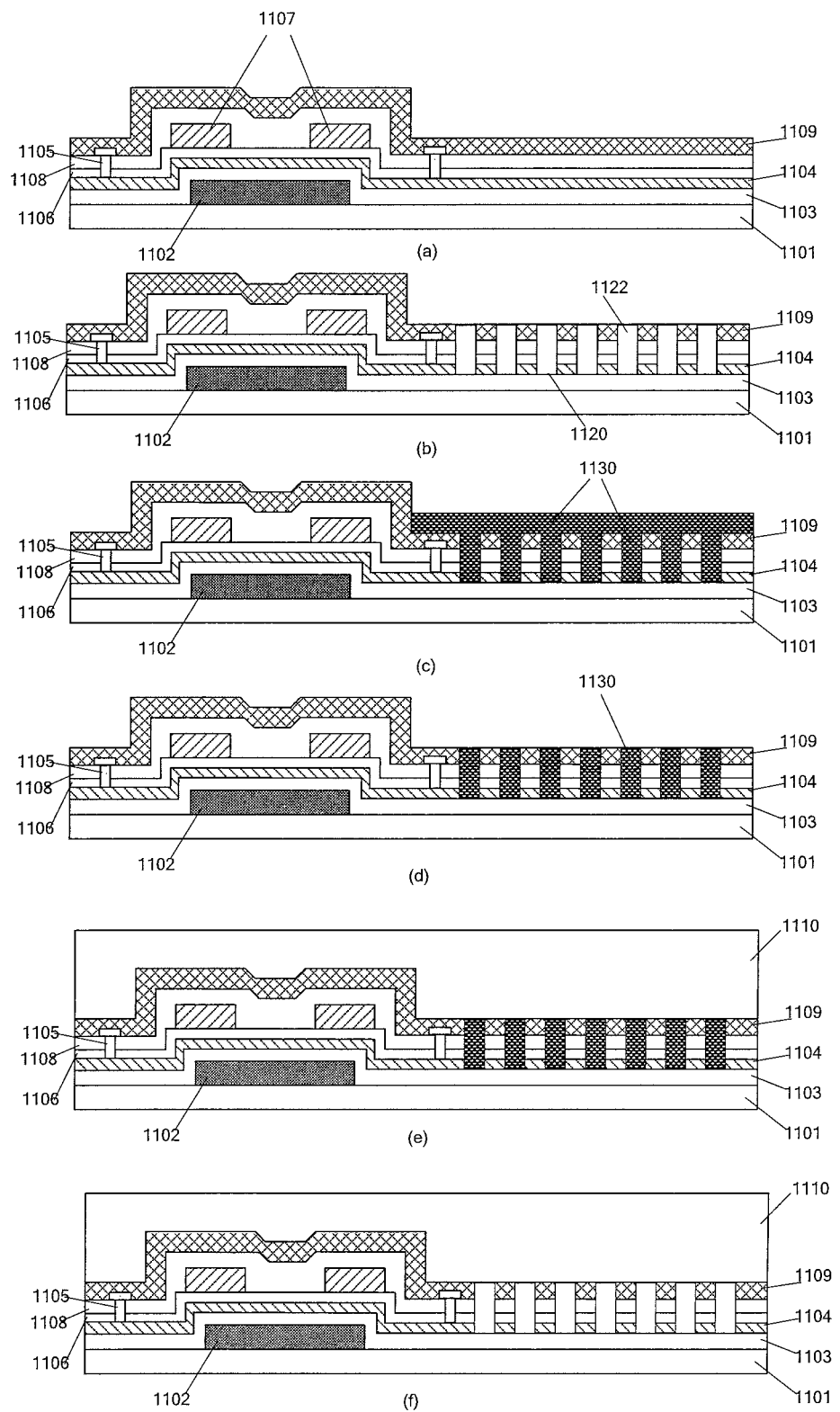
FIG. 11 is a schematic diagram schematically showing steps of a method of forming a sub-wavelength grating according to another embodiment of the present disclosure.

According to another alternative embodiment, FIG. 11 show steps of forming a sub-wavelength grating in the display region of each sub-pixel according to another embodiment of the present disclosure.

As shown in part (a) in FIG. 11, a light shielding layer 1102, a buffer layer 1103, a low temperature polysilicon layer 1104, source and drain electrodes 1105, a gate insulation layer 1106, a gate electrode 1107, an interlayer dielectric layer 1108 and a first passivation layer 1109 are successively formed on a substrate 1101.

As shown in part (b) in FIG. 11, a sub-wavelength grating 1120 is formed in the low temperature polysilicon layer 1104, the gate insulation layer 1106, the interlayer dielectric layer 1108 and the first passivation layer 1109 within the display region of each sub-pixel.

As shown in part (c) in FIG. 11, a sacrificial layer 1130 is deposited on the first passivation layer 1109 formed therein with the sub-wavelength grating 1120.

As shown in part (d) in FIG. 11, portions of the sacrificial layer 1130 located outside of gaps 1122 of the grating are removed.

As shown in part (e) in FIG. 11, a planarization layer 1110 is deposited over the first passivation layer 1109 with the sacrificial layer 1130 thereon.

As shown in part (f) in FIG. 11, portions of the sacrificial layer 1130 located within the gaps 1122 of the grating are removed through an etching process.

According to a further embodiment, a method of manufacturing a pixel structure may comprise following steps: forming a gate electrode, a gate insulation layer, an active layer, source and drain electrodes, and a passivation layer successively on the substrate.

Figure 12:
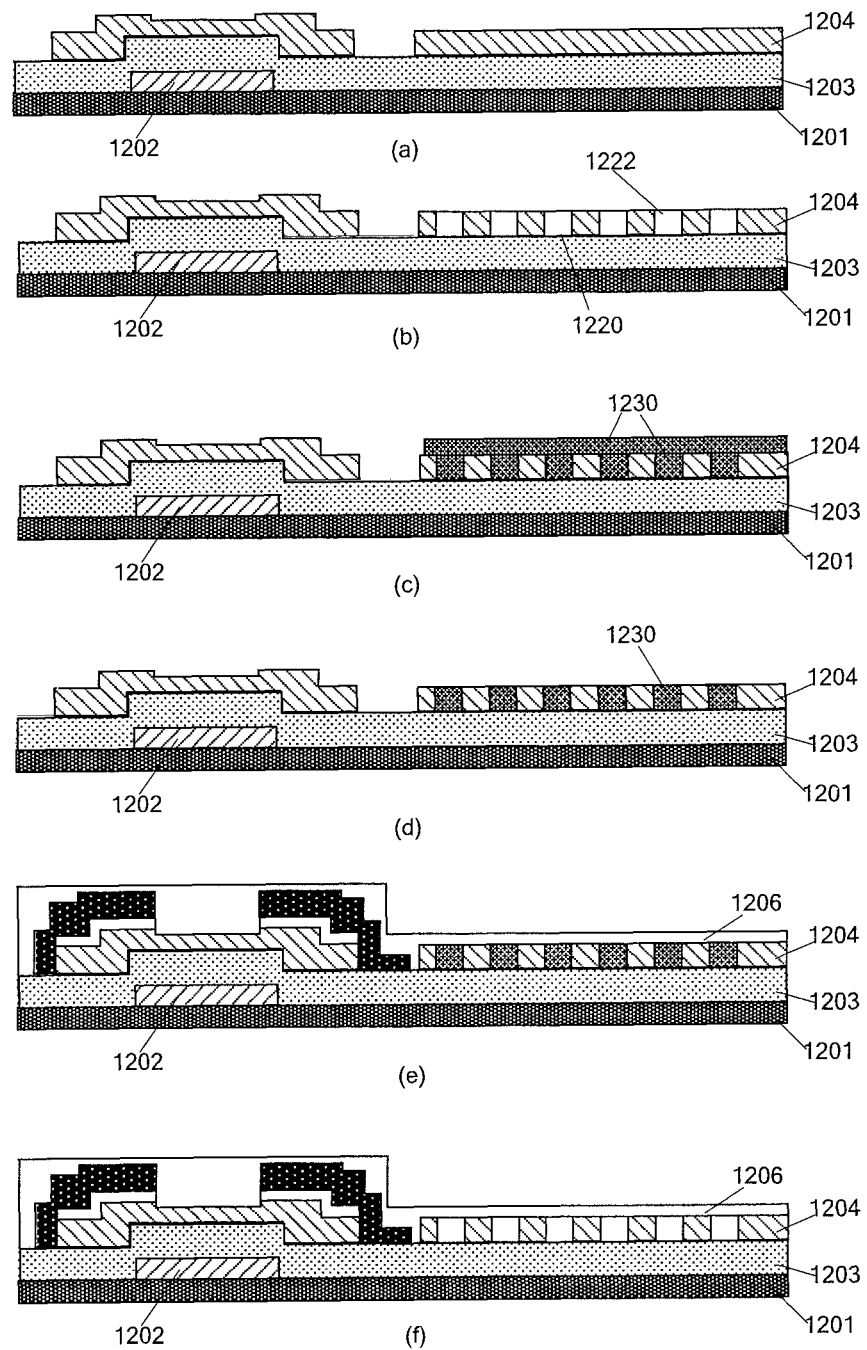
FIG. 12 is a schematic diagram schematically showing steps of a method of forming a sub-wavelength grating according to a further embodiment of the present disclosure.

According to an example, FIG. 12 shows steps of fouling a sub-wavelength grating in the display region of each sub-pixel.

As shown in part (a) in FIG. 12, a gate electrode 1202, a gate insulation layer 1203 and an active layer 1204 are successively formed on a substrate 1201.

As shown in part (b) in FIG. 12, a sub-wavelength grating 1220 is formed in the active layer 1204 within the display region of each sub-pixel.

As shown in part (c) in FIG. 12, a sacrificial layer 1230 is formed on the active layer 1204 formed therein with the sub-wavelength grating 1220.

As shown in part (d) in FIG. 12, portions of the sacrificial layer 1230 located outside of gaps 1222 of the grating are removed.

As shown in part (e) in FIG. 12, a passivation layer 1206 is deposited over the active layer 1204 with portions of the sacrificial layer 1230 thereon.

As shown in part (f) in FIG. 12, portions of the sacrificial layer 1230 located within the gaps 1222 of the grating are removed through an etching process.

In the above embodiments, a process of forming a sacrificial layer is added into processes of forming the pixel structure of the array substrate, such that the sub-wavelength grating may be integrated on the array substrate, thereby integration of the sub-wavelength grating with the array substrate can be easily achieved.

Although several exemplary embodiments according the general concepts of the present disclosure have been shown and described, it would be appreciated by those skilled in the art that various changes or modifications may be made in these embodiments without departing from the principles and spirit of the disclosure, the scope of which is defined in the claims and their equivalents.

What is claimed is:

1. A pixel structure, comprising a plurality of sub-pixels arranged in an array on a substrate, each sub-pixel comprising a display region and a non-display region, the non-display region of each sub-pixel being formed with a thin film transistor therein, wherein the display region of each sub-pixel is formed therein with a sub-wavelength grating for transmitting therethrough light in a predetermined wavelength range, the thin film transistor comprises a gate electrode, and an orthographic projection of the sub-wavelength grating on the substrate is adjacent to and is not overlapped with an orthographic projection of the gate electrode on the substrate, wherein the pixel structure comprises at least three sub-pixels, and the sub-wavelength gratings formed in the display regions of respective sub-pixels have different periods or pitches from each other, so as to transmit therethrough light in different predetermined wavelength ranges respectively, wherein the pixel structure comprises a first sub-pixel, a second sub-pixel and a third sub-pixel, and wherein:

the sub-wavelength grating of the first sub-pixel has a period of 400 nm and a pitch of 121 nm, for transmitting red light therethrough;

the sub-wavelength grating of the second sub-pixel has a period of 350 nm and a pitch of 119 nm, for transmitting green light therethrough; and the sub-wavelength grating of the third sub-pixel has a period of 440 nm and a pitch of 263 nm, for transmitting blue light therethrough.

2. The pixel structure according to claim 1, wherein each sub-pixel comprises a low temperature polysilicon layer, source and drain electrodes, a gate insulation layer, the gate electrode, an interlayer dielectric layer, a first passivation layer and a planarization layer successively formed on the substrate.

3. The pixel structure according to claim 2, wherein the sub-wavelength grating is only formed in the low temperature polysilicon layer.

4. The pixel structure according to claim 2, wherein the sub-wavelength grating is formed in layers comprising the low temperature polysilicon layer and at least one selected from a group consisting of the gate insulation layer, the interlayer dielectric layer and the first passivation layer.

5. The pixel structure according to claim 1, wherein each sub-pixel comprises the gate electrode, a gate insulation layer, an active layer, source and drain electrodes, and a passivation layer successively formed on the substrate.

6. The pixel structure according to claim 5, wherein the sub-wavelength grating is formed in the active layer.

7. The pixel structure according to claim 5, wherein the sub-wavelength grating is formed in the gate insulation layer.

8. An array substrate, comprising the pixel structure of claim 1.

9. A display device, comprising the array substrate of claim 8, a backlight unit and a liquid crystal unit.

10. A method of manufacturing a pixel structure, comprising:

forming a plurality of sub-pixels arranged in an array on a substrate, each sub-pixel comprising a display region and a non-display region;

forming a thin film transistor in the non-display region of each sub-pixel, the thin film transistor comprising a gate electrode; and forming a sub-wavelength grating in the display region of each sub-pixel, for transmitting therethrough light in a predetermined wavelength range, wherein an orthographic projection of the sub-wavelength grating on the substrate is adjacent to and is not overlapped with an orthographic projection of the gate electrode on the substrate, wherein the step of forming the plurality of sub-pixels arranged in the array on the substrate comprises: forming at least three sub-pixels arranged in the array on the substrate, wherein the step of forming the sub-wavelength grating in the display region of each sub-pixel comprises: forming the sub-wavelength grating in the display region of each of the at least three sub-pixels, wherein the sub-wavelength grating formed in the display regions of respective sub-pixels have different periods or pitches from each other so as to transmit therethrough light in different predetermined wavelength ranges respectively, wherein the at least three sub-pixels comprises a first sub-pixel, a second sub-pixel and a third sub-pixel, and wherein:

the sub-wavelength grating of the first sub-pixel has a period of 400 nm and a pitch of 121 nm, for transmitting red light therethrough;

the sub-wavelength grating of the second sub-pixel has a period of 350 nm and a pitch of 119 nm, for transmitting green light therethrough; and the sub-wavelength grating of the third sub-pixel has a period of 440 nm and a pitch of 263 nm, for transmitting blue light therethrough.

11. The method according to claim 10, further comprising:

forming a low temperature polysilicon layer, source and drain electrodes, a gate insulation layer, the gate electrode, an interlayer dielectric layer, a first passivation layer and a planarization layer successively on the substrate.

12. The method according to claim 11, wherein the step of forming the sub-wavelength grating in the display region of each sub-pixel comprises:

forming the sub-wavelength grating in the low temperature polysilicon layer in the display region of each sub-pixel;

depositing a sacrificial layer on the low temperature polysilicon layer formed therein with the sub-wavelength grating;

removing portions of the sacrificial layer located outside of gaps of the grating;

depositing a gate insulation layer over the low temperature polysilicon layer with the sacrificial layer thereon; and removing portions of the sacrificial layer located within the gaps of the grating through an etching process.

13. The method according to claim 11, wherein the step of forming the sub-wavelength grating in the display region of each sub-pixel comprises:

forming a sub-wavelength grating in the low temperature polysilicon layer, the gate insulation layer, the interlayer dielectric layer and the first passivation layer within the display region of each sub-pixel;

depositing a sacrificial layer on the first passivation layer formed therein with the sub-wavelength grating;

removing portions of the sacrificial layer located outside of gaps of the grating;

depositing a planarization layer over the first passivation layer with the sacrificial layer thereon; and removing portions of the sacrificial layer located within the gaps of the grating through an etching process.

14. The method according to claim 10, further comprising:

forming the gate electrode, a gate insulation layer, an active layer, source and drain electrodes, and a passivation layer successively on the substrate.

15. The method according to claim 14, wherein the step of forming the sub-wavelength grating in the display region of each sub-pixel comprises:

forming the sub-wavelength grating in the active layer within the display region of each sub-pixel;

depositing a sacrificial layer on the active layer formed therein with the sub-wavelength grating;

removing portions of the sacrificial layer located outside of gaps of the grating;

depositing a passivation layer over the active layer with portions of the sacrificial layer thereon; and removing portions of the sacrificial layer located within the gaps of the grating through an etching process.

* * * * *